US008680973B2

(12) United States Patent
Kruest et al.

(10) Patent No.: US 8,680,973 B2
(45) Date of Patent: Mar. 25, 2014

(54) SYSTEMS AND METHODS FOR SYNCHRONIZING A PLURALITY OF RFID INTERROGATORS IN A THEATRE OF OPERATION

(75) Inventors: James Robert Kruest, San Diego, CA (US); Gary Bann, Cary, NC (US)

(73) Assignee: Neology, Inc., Poway, CA (US)

( * ) Notice: Subject to any disclaimer, the term of this patent is extended or adjusted under 35 U.S.C. 154(b) by 1093 days.

(21) Appl. No.: 11/766,749

(22) Filed: Jun. 21, 2007

(65) Prior Publication Data

US 2008/0018489 A1      Jan. 24, 2008

Related U.S. Application Data

(60) Provisional application No. 60/805,423, filed on Jun. 21, 2006.

(51) Int. Cl.
*G08C 19/16*      (2006.01)
(52) U.S. Cl.
USPC ....... 340/12.31; 340/10.3; 375/356; 375/357; 370/507; 370/503
(58) Field of Classification Search
USPC ...................................... 340/10.3, 825, 10.1
See application file for complete search history.

(56) References Cited

U.S. PATENT DOCUMENTS

| | | | |
|---|---|---|---|
| 4,660,127 A | 4/1987 | Gunter | |
| 5,117,746 A | 6/1992 | Sharp | |
| 5,751,220 A * | 5/1998 | Ghaffari | ................... 340/12.31 |
| 5,942,977 A | 8/1999 | Palmer et al. | |
| 6,060,992 A | 5/2000 | Huang et al. | |
| 6,118,379 A | 9/2000 | Kodukula et al. | |
| 6,259,353 B1 | 7/2001 | Berger et al. | |
| 6,330,971 B1 | 12/2001 | Mabry et al. | |
| 6,538,564 B1 | 3/2003 | Cole | |
| 6,563,425 B2 | 5/2003 | Nicholson et al. | |
| 6,643,801 B1 | 11/2003 | Jammu et al. | |
| 6,720,930 B2 | 4/2004 | Johnson et al. | |
| 6,724,308 B2 | 4/2004 | Nicholson | |

(Continued)

FOREIGN PATENT DOCUMENTS

| | | |
|---|---|---|
| GB | 2328839 A | 1/2014 |
| MX | 297024 | 3/2012 |

OTHER PUBLICATIONS

Young, Lee W., Authorized Officer, in Application PCT/US07/71823, in International Search Report and Written Opinion, mailed Feb. 14, 2008, 9 pages.

*Primary Examiner* — Brian Zimmerman
*Assistant Examiner* — Sara Samson
(74) *Attorney, Agent, or Firm* — Procopio, Cory, Hargreaves & Savitch LLP; Noel C. Gillespie

(57) ABSTRACT

RFID tags are used for many purpose including tracking. RFID interrogators are used to retrieve information from tags. In many applications, a plurality of RFID interrogators are required. Synchronization between interrogators in the same theatre of operation is critical to ensure that their broadcasts do not interfere with each other. In fixed RFID interrogator applications, RFID interrogators can be wired together allowing a channel to synchronize the transmissions of the RFID interrogators. Methods described herein can ensure that synchronization is maintained in the event of the failure of a synchronizing master. Furthermore, additional methods for synchronizing RFID interrogators in wireless applications are described allowing synchronization in the absence of wired connections between interrogators.

7 Claims, 11 Drawing Sheets

(56) References Cited

U.S. PATENT DOCUMENTS

| | | |
|---|---|---|
| 6,750,771 B1 | 6/2004 | Brand |
| 6,812,838 B1 | 11/2004 | Maloney |
| 6,983,033 B1 | 1/2006 | Jenkins |
| 6,989,796 B2 | 1/2006 | Rahim |
| 7,075,435 B2 | 7/2006 | Jesser |
| 7,176,799 B1 | 2/2007 | Golicz et al. |
| 7,183,922 B2 | 2/2007 | Mendolia et al. |
| 7,339,120 B2 | 3/2008 | Notohara et al. |
| 7,342,499 B2 | 3/2008 | Chiu et al. |
| 7,391,325 B2 | 6/2008 | Cobianu et al. |
| 7,432,816 B1 | 10/2008 | Ku et al. |
| 7,701,351 B2 | 4/2010 | Kawai et al. |
| 7,884,725 B2 | 2/2011 | Kruest et al. |
| 7,893,833 B2 | 2/2011 | Shachar |
| 7,969,282 B2 * | 6/2011 | Powell et al. ............ 340/10.2 |
| 8,098,134 B2 | 1/2012 | Azevedo et al. |
| 8,179,265 B2 | 5/2012 | Elizondo et al. |
| 8,451,095 B2 | 5/2013 | Azevedo et al. |
| 8,610,580 B2 | 12/2013 | Elizondo et al. |
| 2002/0048462 A1 | 4/2002 | Weinberger et al. |
| 2002/0109636 A1 | 8/2002 | Johnson et al. |
| 2002/0123251 A1 | 9/2002 | Yatskov et al. |
| 2002/0196126 A1 | 12/2002 | Eisenberg et al. |
| 2004/0046663 A1 | 3/2004 | Jesser |
| 2004/0070953 A1 | 4/2004 | Schulz et al. |
| 2004/0085192 A1 | 5/2004 | Hartmann |
| 2004/0150521 A1 | 8/2004 | Stilp |
| 2005/0077353 A1 | 4/2005 | Oishi et al. |
| 2005/0110641 A1 | 5/2005 | Mendolia et al. |
| 2005/0186902 A1 | 8/2005 | Lieffort et al. |
| 2005/0242953 A1 | 11/2005 | Nakagawa et al. |
| 2005/0248455 A1 | 11/2005 | Pope et al. |
| 2006/0001585 A1 | 1/2006 | Saito et al. |
| 2006/0012465 A1 | 1/2006 | Lee |
| 2006/0055539 A1 | 3/2006 | Lawrence et al. |
| 2006/0145864 A1 | 7/2006 | Jacober et al. |
| 2006/0158311 A1 | 7/2006 | Hall et al. |
| 2006/0176152 A1 | 8/2006 | Wagner et al. |
| 2006/0223340 A1 | 10/2006 | Yoneda |
| 2007/0096911 A1 | 5/2007 | Gualtieri |
| 2007/0171071 A1 | 7/2007 | Chiu et al. |
| 2007/0173970 A1 | 7/2007 | Shachar |
| 2007/0279233 A1 | 12/2007 | Ryckman |
| 2008/0024273 A1 | 1/2008 | Kruest et al. |
| 2008/0055094 A1 | 3/2008 | Barber et al. |
| 2008/0315992 A1 | 12/2008 | Forster |
| 2009/0079568 A1 | 3/2009 | Forster et al. |
| 2011/0050426 A1 | 3/2011 | Choong |
| 2011/0163849 A1 | 7/2011 | Kruest et al. |

\* cited by examiner

SYSTEMS AND METHODS FOR SYNCHRONIZING A PLURALITY OF RFID INTERROGATORS IN A THEATRE OF OPERATION

RELATED APPLICATIONS INFORMATION

This application claims priority under 35 U.S.C. 119(e) to Provisional Patent Application Ser. No. 60/805,423, entitled "An RFID Smart Cabinet and a Multi-Document Read Write Station," filed Jun. 21, 2006, which is incorporated herein by reference as if set forth in full.

BACKGROUND

1. Field of the Invention

The field of the invention relates generally to Radio Frequency Identification (RFID) systems and more particularly to systems and methods for synchronizing a plurality of RFID interrogators in a theatre of operation.

2. Background of the Invention

FIG. 1 illustrates a basic RFID system 100. A basic RFID system 100 comprises three components: an antenna or coil 104, an interrogator 102 with decoder 112, and a transponder, or RF tag 106 which is often electronically programmed with unique information. Antenna 104 emits radio signals 110 to activate and read and write data to tag 106. Antenna 104 is the conduit between tag 106 and interrogator 102, which controls data acquisition and communication. Antennas 104 are available in a variety of shapes and size, for example, in certain embodiments they can be built into a door frame to receive tag data from persons or things passing through the door. In other embodiments, antennas 104 can, for example, be mounted on an interstate toll booth to monitor traffic passing by on a freeway. Further, depending on the embodiments, the electromagnetic field, i.e., radio signal 110, produced by an antenna 104 can be constantly present when, e.g., multiple tags 106 are expected continually. If constant interrogation is not required, then radio signal 110 can, for example, be activated by a sensor device.

Often antenna 104 is packaged with interrogator 102. A conventional interrogator 102 can emit radio signals 110 in ranges of anywhere from one inch to 100 feet or more, depending upon the power output and the radio frequency used. When an RFID tag 106 passes through an electromagnetic zone associated with radio signal 110, it detects radio signal 110, which can comprise an activation signal. In some embodiments, interrogators can comprise multiple antenna, though typically only one transmits at a time.

RFID tags 106 come in a wide variety of shapes and sizes. Animal tracking tags, for example, inserted beneath the skin of an animal, can be as small as a pencil lead in diameter and one-half inch in length. Tags 106 can be screw-shaped for insertion, e.g., in order to identify trees or wooden items, or credit-card shaped for use in access applications. Anti-theft hard plastic tags that include RFID tags 106 can be attached to merchandise in stores. Heavy-duty RFID tags can be used to track intermodal containers, heavy machinery, trucks, and/or railroad cars for maintenance and/or tracking purposes. A multitude of other uses and applications also exists, and many more will come into being in the future.

RFID tags 106 are categorized as either active or passive. Active RFID tags 106 are powered by an internal battery and are typically read/write, i.e., tag data can be rewritten and/or modified. An active tag's memory size varies according to application requirements. For example, some systems operate with up to 1 MB of memory. In a typical read/write RFID work-in-process system, a tag 106 might give a machine a set of instructions, and the machine would then report its performance to tag 106. This encoded data would then become part of the tagged part's history. The battery-supplied power of an active tag 106 generally gives it a longer read and write range. The trade off is greater size, greater cost, and a limited operational life.

Passive RFID tags 106 operate without a separate external power source and obtain operating power generated from radio signal 110. Passive tags 106 are consequently much lighter than active tags 106, less expensive, and offer a virtually unlimited operational lifetime. The trade off is that they have shorter read ranges than active tags 106 and require a higher-powered interrogator 102. Read-only tags are typically passive and are programmed with a unique set of data, usually 32 to 128 bits, that cannot be modified. Read-only tags 106 often operate as a license plate into a database, in the same way as linear barcodes reference a database containing modifiable product-specific information. Not all passive tags 106 are read-only tags.

RFID systems are also distinguishable by their frequency ranges. Low-frequency, e.g., 30 KHz to 500 KHz, systems have short reading ranges and lower system costs. They are commonly used in security access, asset tracking, and animal identification applications. High-frequency, e.g., 850 MHz to 950 MHz and 2.4 GHz to 2.5 GHz, systems offer long read ranges, e.g., greater than 90 feet, high reading speeds, and are used for such applications as railroad car tracking and automated toll collection, however, the higher performance of high-frequency RFID systems 100 incurs higher system costs.

The significant advantage of all types of RFID systems 100 is the noncontact, non-line-of-sight nature of the technology. Tags 106 can be read through a variety of substances such as snow, fog, ice, paint, crusted grime, and other visually and environmentally challenging conditions, where barcodes or other optically read technologies cannot typically be used. RFID tags 106 can also be read in challenging circumstances at high speeds, often responding in less than 100 milliseconds. RFID has become indispensable for a wide range of automated data collection and identification applications that would not be possible otherwise.

A conventional RFID interrogator 102 comprises an RF transceiver 116 and a decoder 112. Decoder 112 can, for example, be a micro controller or other processing circuit configured to carryout the required functions. Often, decoder 112 is interfaced with memory 114. Firmware instructions used by decoder 112 to control the operation of interrogator 102 can be stored in memory 114, along with RFID instructions that can be communicated to RFID tag 106 and can be used to control acquisition of information from RFID tags 106. Memory 114 can, depending on the embodiment, comprise one or more memory circuits.

FIG. 2 shows an example transmission operation of an RFID interrogator. Graph 200 shows a transmission of the RFID interrogator when no data is transmitted. At the start of each frame 202, interrogator 102 can be configured to transmit frame synchronization pulses 204, which can have a much shorter width than the period associated with frame 202. RFID interrogator 102 can transmit data to RFID tag 106 by modifying the frame synchronization pulses, for instance by doubling the pulses to represent a binary "zero" and tripling the synchronization pulses to represent a binary "one." Graph 220 shows an example of such a transmission method by an RFID interrogator. Double pulses 222 and 230, which comprise two pulses sent within a short period compared to the frame period; represent the transmission of a "zero." Triple pulse 226, which comprise three pulses sent within a short period compared to the frame period, represent the transmission of a "one." Remaining single pulses 224 and 228 do not represent data and synchronize the associated frames.

Another method of modifying frame synchronization pulses used by RFID interrogators is to use wider pulses to represent a "zero" and still wider pulses to represent a "one." Graph 240 shows an example of such a transmission method. The "wider" pulses 242 and 250, which are still short compared to the frame period, represent the transmission of a "zero." The "widest" pulse 246, which is still short compared to the frame period but wider than pulses 242 and 250, represent the transmission of a "one." The remaining "normal" width pulses 244 and 248 do not represent data and synchronize the associated frames 202.

Graphs 220 and 240 illustrate just two possible examples of communication protocols that can be used to facilitate transmission of data utility system 103.

In response to interrogation signals from the interrogator 102, RFID tags 106 can be configured to respond in the second half of frames 202. Furthermore, in many embodiments of an RFID interrogation systems 100 both tags 106 and interrogator 102 operate in the same frequency range. The synchronization pulses, whether "normal" or modified to carry data, can serve two additional purposes. First, the pulses can be used to define the boundaries of frames 202 so the tags 106 can respond at the appropriate time. Second, the pulses supply power for passive RFID tags 106.

FIG. 3 depicts an interrogation theatre 300 comprising a plurality of interrogators, of which interrogators 310 and 340 are shown for illustrative purposes. In addition, theatre 300 comprises a plurality of tags, of which tags 320, 322, and 344 are shown for illustrative purposes. Tags 320, 322, and 344 can for example, be similar to, or the same as, tag 106 described above. If allowed to operate independently, these readers can severely interfere with each other. To illustrate, in FIG. 3, RFID tags 320 and 322 are near interrogator 310, while RFID tag 344 is near interrogator 340. Temporally, interrogator 310 has just transmitted its request through its antenna 312 and is now awaiting a response signal from any nearby RFID tags. Because RFID tags 320 and 322 are near to interrogator 310, they respond with RF signals 330 and 332, respectively; however, at approximately the same time, interrogator 340 wishes to interrogate RFID tags nearby such as RFID tag 344, by transmitting signal 346 through antenna 342. Since the responses 330 and 332 are on the same frequency as the interrogation signal 346, and interrogation signal 346 can be of greater power than signals 330 and 332, interrogator 310 may only detect the signal from interrogator 340 rather than from RFID tags 320 and 322.

FIG. 4 depicts the timing of the example given above. Graph 400 depicts interrogator 310 attempting to interrogate nearby RFID tags using the communications protocol illustrated by graph 220. RFID tag 320 responds and its RF output signal 330 is graphed over time in graph 410; however, with an unsynchronized RFID interrogator 340 also attempting to interrogate nearby RFID tags as depicted in graph 420, associated signal 346 can interfere with signal 330. As a result, antenna 312 sees the signal depicted in graph 430, where rather than seeing pulses 412 and 414 of signal 330 (graph 410), interrogator 310 is likely to see something like pulses 432 and 436 dominated by the influence of signal 346 (graph 420) of interrogator 340. As a result, interrogator 310 may interpret pulses 434 and 438 of interrogator 340 as coming from RFID tag 320, or interrogator 310 may just fail to code any signal or may receive corrupted information.

SUMMARY

An RFID system comprises a plurality of synchronized RFID interrogators. Synchronization between interrogators in the same theatre of operation can be critical to ensure that their broadcasts do not interfere with each other. In fixed RFID interrogator applications, RFID interrogators can be wired together to allow synchronization of transmissions of the RFID interrogators.

In one aspect, synchronization is maintained in the event of the failure of a synchronizing master.

In another aspect, synchronizing RFID interrogators in the absence of wired connections between interrogators is provided.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION

Figure 1:
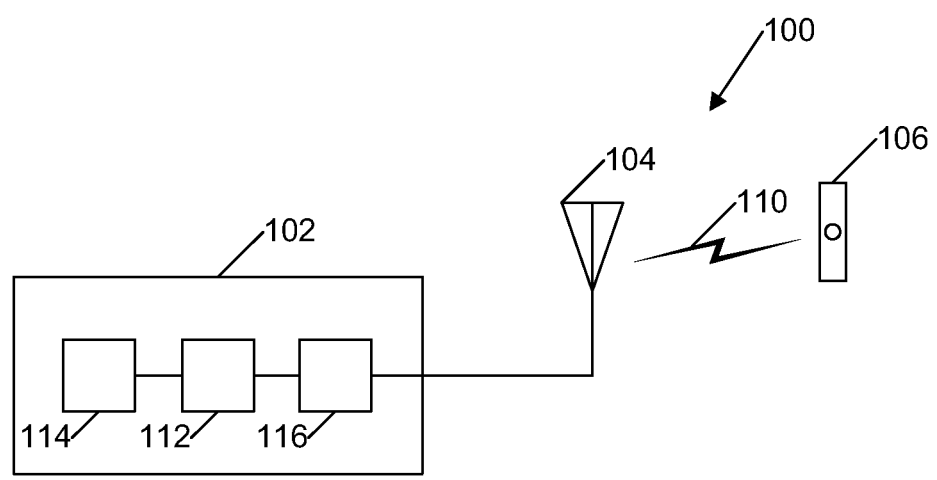
FIG. 1 is a diagram illustrating an exemplary RFID system 100.

In one embodiment, synchronization signal 512 supplied by synchronization master 510 can be used by interrogators 520, 530, and 540 to ensure that the corresponding interrogator signals 524, 534, and 544 do not interfere with reception of signals transmitted by RFID tags 550-564. For example, if graphs 620, 630, and 640 correspond to signals 544, 534, and 524, respectively, then it can be seen that synchronization signal 512 (graph 610) can cause each interrogator to begin transmission at the start of a common frame period. In other words, interrogators 520, 530, and 540 can be configured such that each interrogator upon receipt of a pulse in signal 512. This can ensure that each interrogator is finished transmitting before the start of the second half of frame 604, devoted by dashed line 606, during which responses from RFID tags 550-564 we received. Thus, interference signals 524, 534, and 544 with those transmitted from RFID tags 550-564 can be avoided.

As mentioned above, the start 602 of frames 604, depending on the requirements of a particular implementation, begin some fixed period (Δd) after the rising edge of the pulses comprising signal 512 as illustrated on graph 610. The delay (Δd) can, for example, be long enough to account for various delays associated with the circuitry comprising interrogators 520, 530, and 540.

Figure 3:
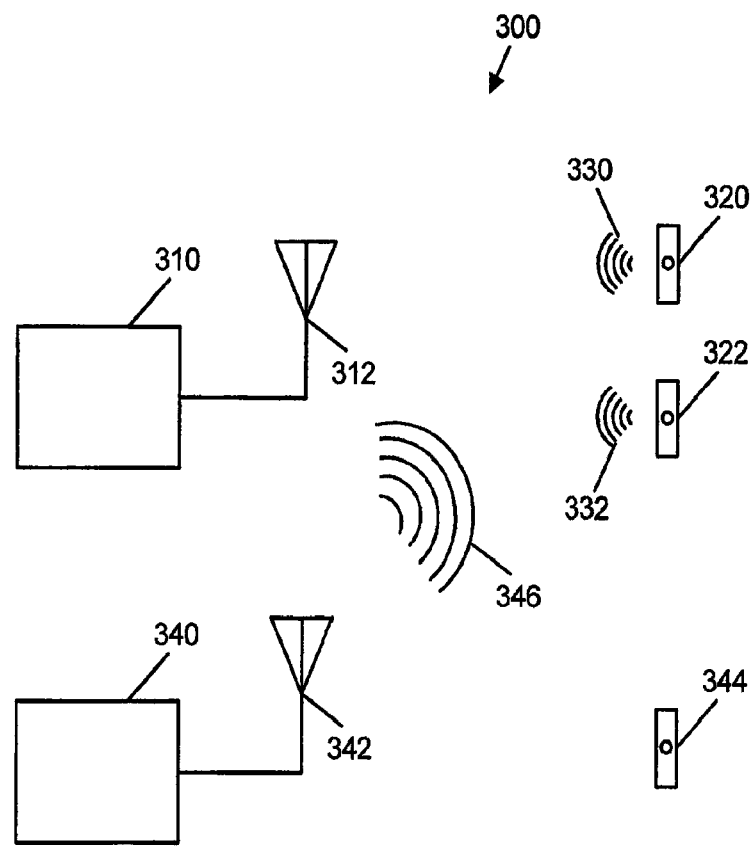
FIG. 3 is a diagram illustrating an exemplary interrogation theatre comprising a plurality of interrogators.
Figure 4:
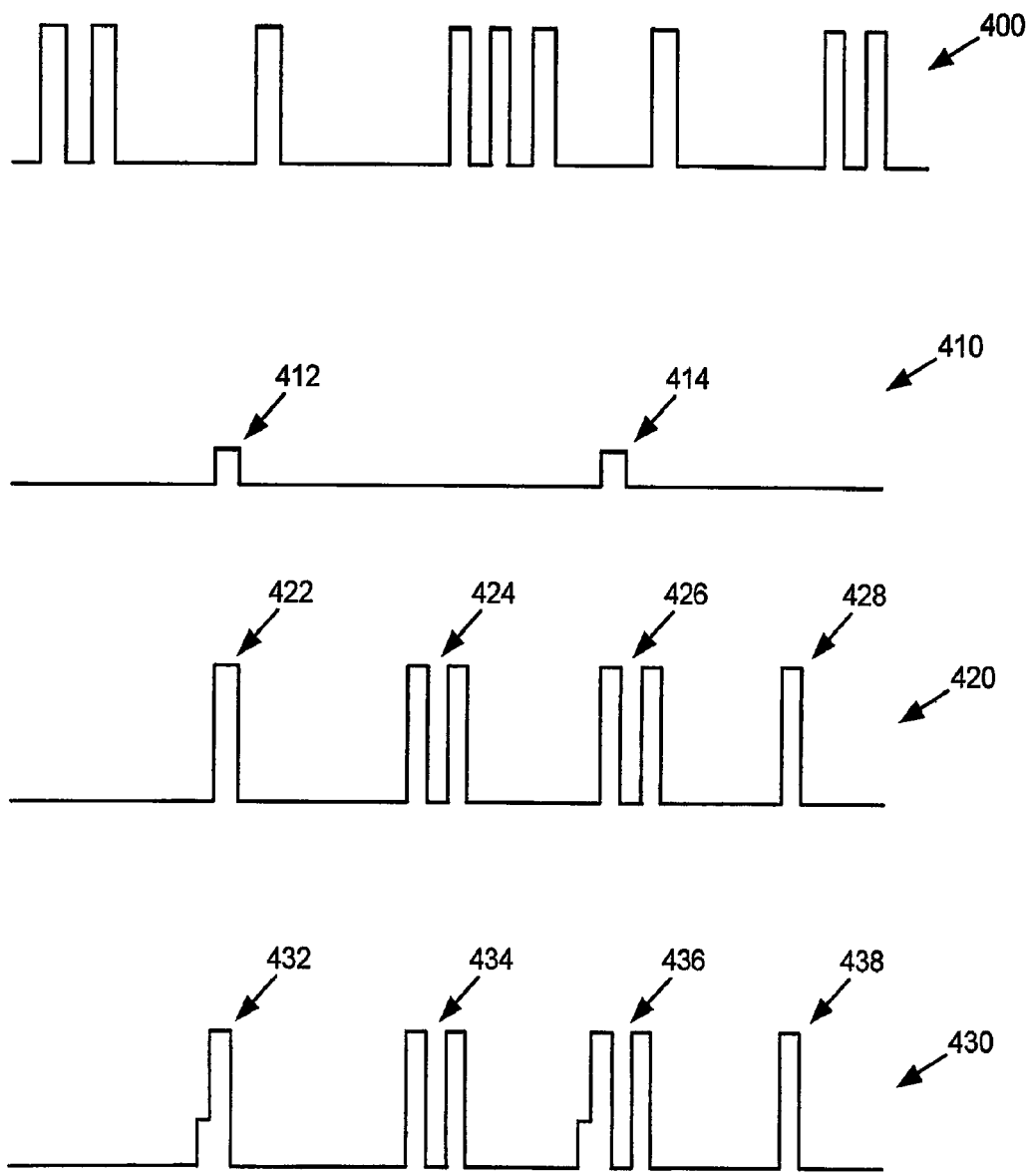
FIG. 4 is a diagram illustrating example signals and timing for the theatre of FIG. 3.
Figure 5:
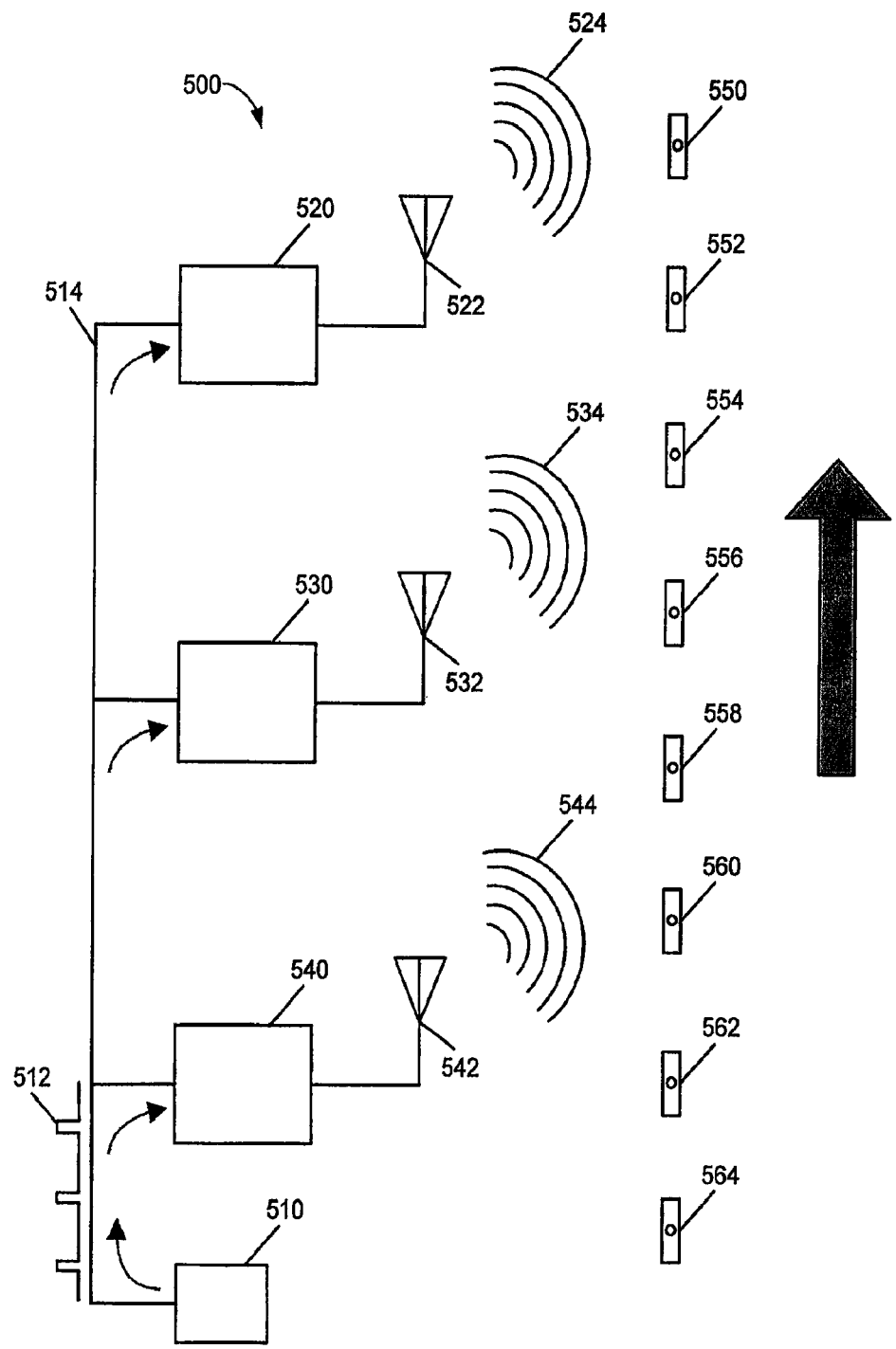
FIG. 5 is a diagram illustrating an example baggage tracking system that includes a plurality of interrogators synchronized in accordance with one embodiment.
Figure 6:
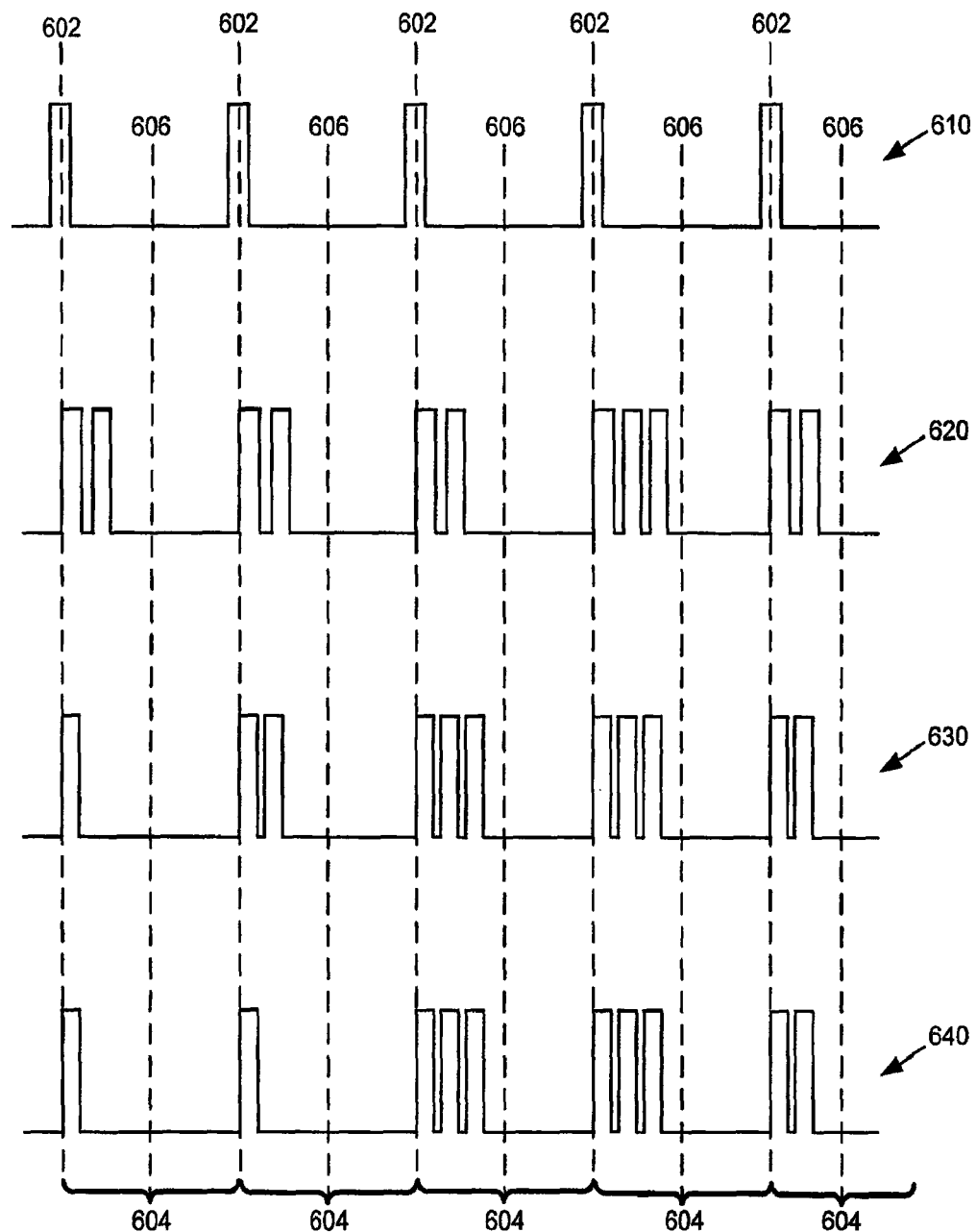
FIG. 6 is a diagram illustrating example signals and timing for the system of FIG. 5.

In order to avoid the problem illustrated in FIGS. 3 and 4, for example, interrogators in a theatre of operation 300 can be synchronized as described herein. FIGS. 5 and 6 illustrate an embodiment of a system 500 with multiple interrogators in a single theatre of operation. In one embodiment, for example, such a system can be employed in a baggage tracking system, e.g., at an airport.

FIG. 5 depicts a baggage tracking system 500 where a plurality of interrogators 520, 530 and 540 are synchronized in accordance with the systems and methods described herein. In airport baggage tracking system 500, the objective is to track the time and identity of each bag that passes by various checkpoints. To facilitate this objective, an RFID interrogator is placed at each checkpoint. Each bag is equipped with a baggage tag comprising an RFID tag. Upon the check-in, each bag is placed on some sort of conveyance mechanism, such as a conveyor belt. RFID tags 550, 552, 554, 556, 558, 560, 562 and 564 represent the RFID tags embedded in the baggage tags affixed on each bag. Each bag traverses the checkpoint monitored by interrogator 540, then the checkpoint monitored by interrogator 530, followed by the checkpoint monitored by interrogator 520.

Figure 2:
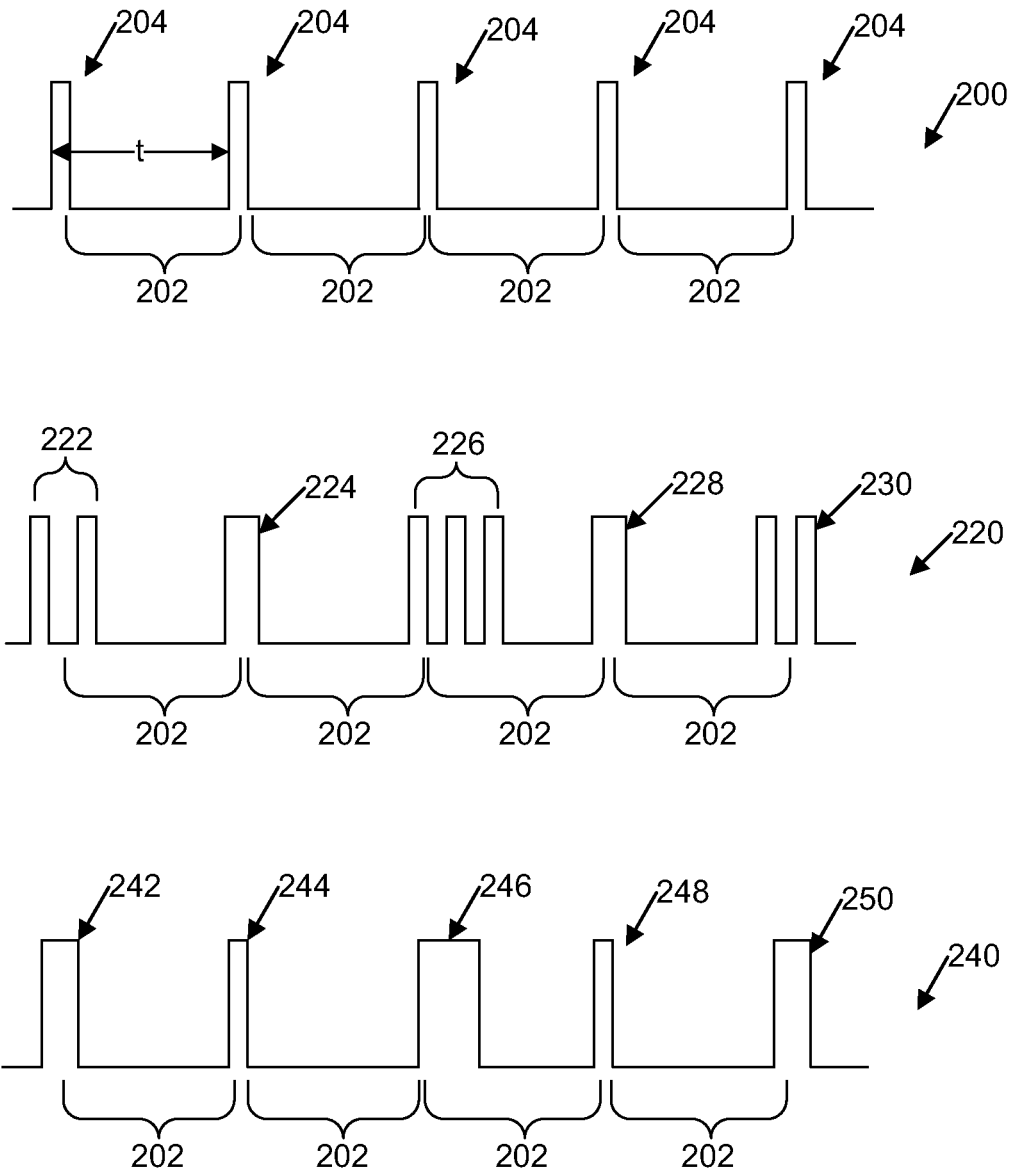
FIG. 2 is a diagram illustrating example transmission protocols that can be used in the system of FIG. 1.

Interrogators 520, 530, and 540 are coupled together and to a synchronization master 510, which is responsible for synchronizing the interrogators. In this embodiment, the coupling is accomplished through wiring 514. As depicted in FIG. 5, synchronization master 510 can be a simple pulse generator; however, in other embodiments one of interrogators 520, 530, and 540 can serve as a synchronization master. The master transmits, e.g., master 510 can be configured to transmit a pulse train 512 to each of interrogators 520, 530 and 540. Interrogators 520, 530, and 540 can be configured, upon receiving the synchronization pulse, to transmit through antennas, 522, 532, and 542, respectively, a radio signal 524, 534, and 544, respectively, to interrogate passing RFID tags 550-564. Signals 524, 534, and 544 can be synchronization pulses or can carry information, e.g., using the exemplary communication protocols illustrated in FIG. 2.

FIG. 6 illustrates an example of the signals and synchronization pulses transmitted by interrogators 520, 530, and 540. Graph 610 depicts synchronization pulse train 512. Graph 620, 630, and 640 depict the signal outputs of interrogators 520, 530, and 540, respectively. In some implementations, the start 602 of the RF frames 604 do not correspond precisely with the leading edges of the pulses in graph 610, because there can be some propagation delay in the circuitry associated with interrogators 520, 530, and 540. A certain amount of inconsistency in the delay can be tolerated, because responses to interrogation signals are expected in the second half of the frame. As explained in detail below, each interrogator can transmit different signals without interfering with other interrogator's ability to receive RFID tag responses because regardless of the type of signal, all transmissions by all interrogators are concluded by the start of the second half of the frame 604 as illustrated by dashed lines 606.

Thus, RFID interrogators 520, 530, and 540 can be coupled to a synchronization master 510 configured to synchronize transmissions from the interrogators; however, in the event of a failure associated with synchronization master 510, system 500 can lose its ability to synchronize the signals of interrogators 520, 530, and 540. In one embodiment, this is avoided by enabling one of the remaining interrogators to become the synchronization master. Accordingly, when employing such a cooperative strategy, an interrogator can be in one of two states a synchronization master or a synchronization slave. Thus, one or more of the interrogators in a system configured to implement such a cooperative strategy must be able to both send and receive a synchronization signal.

Figure 7:
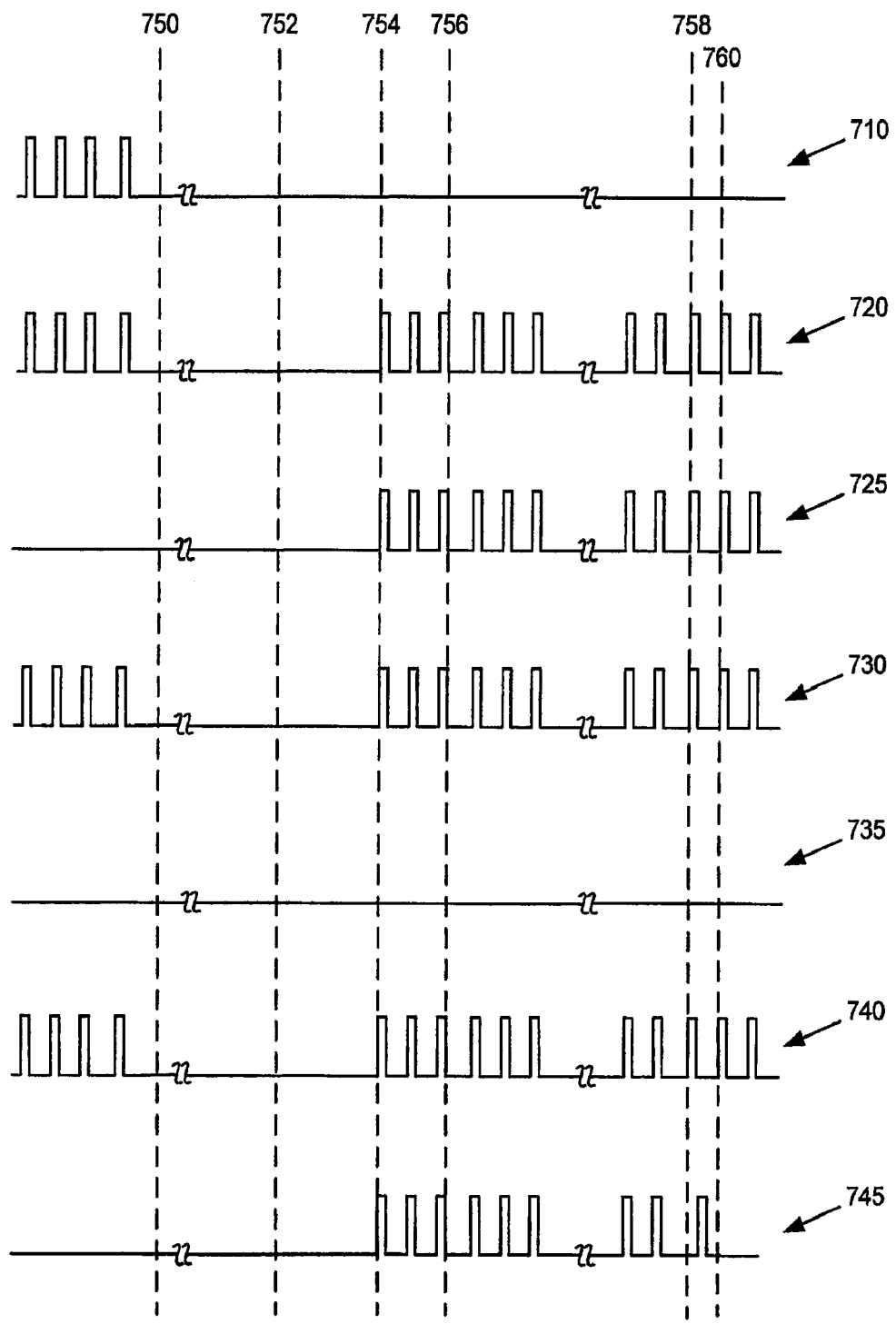
FIG. 7 is a diagram illustrating a temporal overview of a self-promotion process for synchronized interrogators in accordance with one embodiment.

FIG. 7 is a diagram illustrating a temporal view of signals generated in a system employing such a cooperative strategy. In this example, each interrogator in the system is capable of both sending and receiving an interrogator signal. The system begins with an interrogator, or alternatively a signal generator, as a synchronization master configured to generate a synchronization signal as described above and illustrated in graph 710. In this particular embodiment, there are three slave interrogators whose radio frame synchronization signals are depicted in graphs 720, 730 and 740 and whose synchronization signals are depicted in graphs 725, 735, and 745. At 750, the synchronization master suffers a failure and ceases to generate the synchronization signal.

If just one of the interrogators in the system is capable of taking over as master, which is possible depending on the embodiment, then that interrogator will be promoted to master upon detecting the failure of the original synchronization master.

Such configurations can be sufficient to avoid synchronization failures; however, a potential drawback to such configurations is that there is no mechanism to ensure synchronization should one promoted interrogator subsequently fail, fails to generate of synchronization signal, or fails to be promoted. Thus, it can be preferable, depending on the implementation, for a plurality of interrogators to be capable of promotion to master. In such embodiments, there must be some mechanism for determining which interrogator will become the next master.

In one embodiment, the interrogators do not recognize an outage until a predetermined period of time has expired at 752. From there each interrogator selects a random period of time to wait before it attempts to become the new synchronization master. Here, the first interrogator selects the interval between 752 and 754. The second interrogator selects the interval between 752 and 756, which happens to be a longer interval. The third interrogator happens to randomly pick the interval between 752 and 754, the same as the first interrogator. These wait intervals should be large compared to the frame period. In another embodiment, each interrogator at some point in its normal process can select a random time out period before registering a failure of the master. To use the same example, the period would be that between 750 and 754 for the first interrogator, between 750 and 756 for the second interrogator, and between 750 and 754 for the third interrogator.

Each interrogator can be configured to send a pulse after the associated wait period to the other interrogators indicating its attempt to become the master. The other interrogators, upon receiving the pulse, can be configured to remain slaves. The new synchronization master can then send its synchronization signal to the other interrogators. A conflict can arise in the unlikely event that two or more interrogators pulse at the same time, which would be the case in the example above. In other embodiments, various schemes can be used to avoid such conflicts, or contentions. For example, in some embodiments, collision avoidance schemes can be used. Factors such as skew in the clocks of each interrogator can eventually lead to a dispersion of the pulses generated. At this point, one of the interrogators will be seen as pulsing first relative to the others. This interrogator will then become the master and the others demoted to being slave interrogators. For example, at time 758, the pulse, generated by the third interrogator begins to trail those of the first interrogator. The third interrogator can be configured to detect that it is no longer the master, and cease to generate synchronization pulses at time 760.

Figure 8:
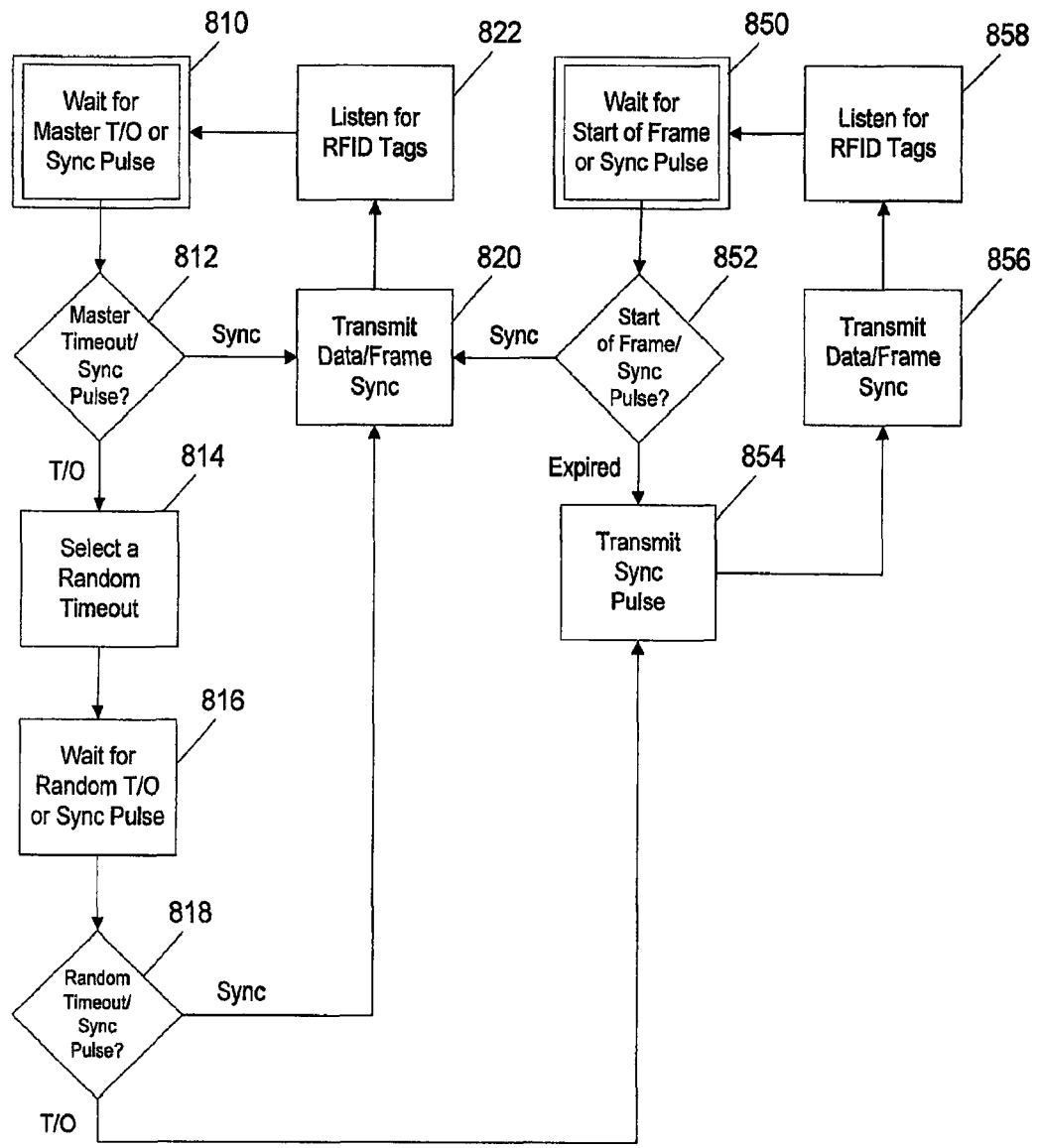
FIG. 8 is a flowchart illustrating an example method for interrogator promotion in accordance with one embodiment.

FIG. 8 illustrates a flowchart illustrating an example method for interrogator promotion in accordance with the systems and methods. Wait states 810 and 850 represent the general waiting states for an interrogator in the slave state and in the master states, respectively. For example, most interrogators start in wait state 810. They can transition out of wait state 810 to step 812 if either a synchronization pulse is received from another interrogator or a predetermined period of time has elapsed since a synchronization pulse from a master was expected. This predetermined period is typically much larger than the frame period. If a synchronization pulse is detected, the interrogator remains a slave and can perform its regular duties by sending either a frame synchronization pulse or data to an RFID tag at step 820, and if appropriate, it can listen for RFID tag responses at step 822. Upon completion of the frame, the interrogator returns to wait state 810. On the other hand, if a synchronization pulse from a master has not been detected, at step 814, a timeout interval is selected, e.g., randomly generated as described above, the timeout interval can be within a predetermined range, which is typically many times the frame period. The interrogator then waits at step 816 for either this timeout period to expire or for a synchronization pulse from another interrogator.

If a synchronization pulse is received at step 818, the interrogator remains a slave and can continue to perform its regular duties starting at step 820; however, if the timeout expires then the interrogator attempts to become a master at step 854 by transmitting a synchronization pulse to all the other interrogators. It then can continue to perform its regular duties by sending either a frame synchronization pulse or data to an RFID tag at step 856 and then if appropriate, it can listen for RFID tag responses at step 858. Upon completion of its regular duties, the interrogator returns to wait state 850. In wait state 850, the interrogator waits for either the start of the next frame, which is one frame period after it sent the last synchronization pulse to the other interrogators, or for a synchronization pulse from another interrogator.

In step 852, if the interrogator detects a start of frame, it transmits a synchronization pulse to the other interrogators in step 854 and the process repeats as before. But if the interrogator detects another synchronization from another interrogator, it ceases to be, a master, becomes a slave, and resumes slave duties at step 820. This can occur, for example, where the original master whose failure initiated the promotion from slave to master of steps 814-854 comes back online. This can also occur if during the promotion from slave to master one or more other interrogators waited the same random interval and were simultaneously promoted to master and over time, the internal clocks of the interrogators are skewed resulting in slight deviations in the pulse interval.

Though extremely unlikely, there may be a situation where three or more interrogators claim to be masters. Thus, in certain embodiments, each interrogator can be configured to determine under such circumstances that one of the other interrogators is the rightful master, which will cause each interrogator to switch to a slave state. At this point, no synchronization pulses are sent by any interrogator and the process for each interrogator follows the diagram in FIG. 8 by traversing steps 812, 814, 816 and 818. At which point, a new master is selected. Alternatively, skewing that results from differences in the tolerances and errors associated with the circuitry of each interrogator can be relied on to eventually result in one interrogator being promoted over the others as described above. Obviously, the more interrogators involved the longer such a process will take. Therefore, some alternatives as described above that reduces the delay involved can be preferable for selecting among three or more contending master interrogators.

It should be noted that in another embodiment, a random predetermined timeout greater than the predetermined "master timeout" and less than the sum of the "master timeout" and the "random timeout" range could be used in wait state 810, thereby combining steps 812, 814, 816, and 818 into a single branch point where the detection of a synchronization pulse transitions the interrogator to step 820 and the expiration of this new predetermined timeout promotes the interrogator to a master state by transitioning to step 854. Such a hybrid timeout period can be used, for example, when an interrogator changes master-slave state, when a new frame is detected, when the tenth new frame is detected, etc.

Though the above embodiments address the synchronization issues relating to the operation of multiple interrogators in a single theatre of operation, there are many applications where the wired approach described in the preceding examples is not feasible, e.g., where the RFID interrogators are mobile such as those mounted on a forklift in a warehouse tracking application, or those used as hand-held scanners in a shipment tracking application. Accordingly, one or more wireless communication links can be used to achieve synchronization. Any such wireless approach should provide an inefficient use of power and spectrum associated with the wireless communication channel or link. For instance, ideally a master interrogator should be as centrally located as possible; however, in mobile applications, the interrogators can move around in the theatre of operation. This can lead to inefficient use of power and spectrum since a master interrogator needs to generate sufficient power to be detected by even the most remote interrogator in the theatre of operation. But since it is an objective to mitigate interference between nearby interrogators, synchronization need only be enforced when interrogators are close enough to cause interference. Thus, in certain embodiments, interrogator synchronization is only employed when interference from other interrogators is detected.

Figure 9:
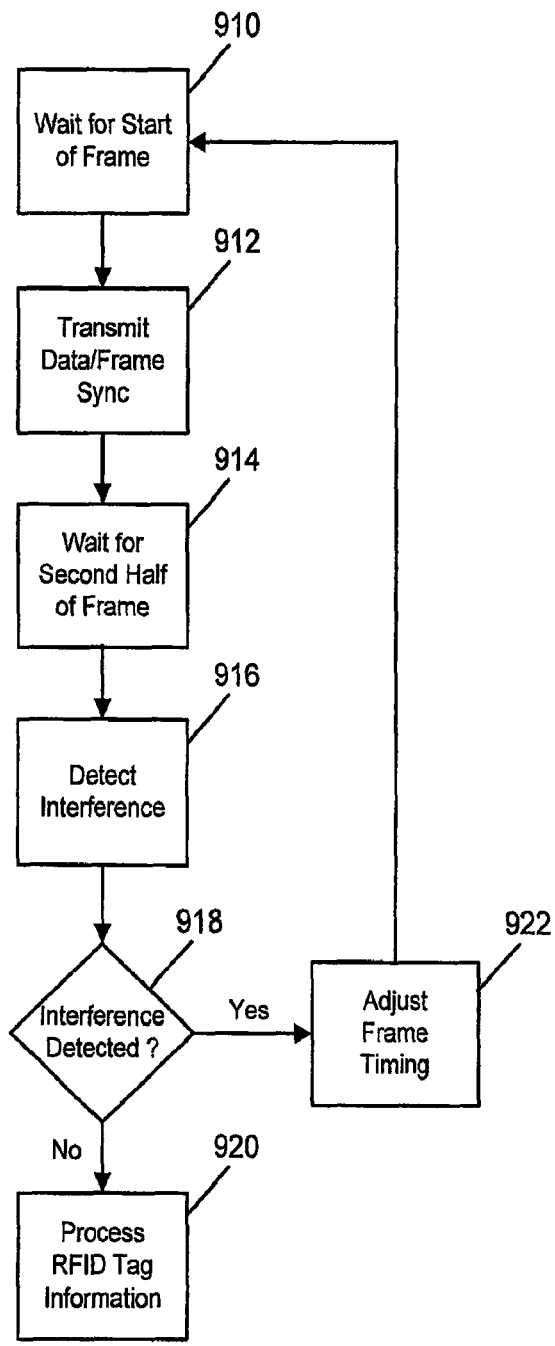
FIG. 9 is a flowchart illustrating an example method for adjusting frame synchronization pulses, when interference is detected in accordance with one embodiment.

FIG. 9 is a flowchart illustrating an example method for adjusting frame synchronization pulses, when interference is detected, in accordance with the systems and methods described herein. In step 910, the interrogator waits for the start of frame. In step 912, the interrogator transmits its frame synchronization or data to nearby RFID tags at the start of the frame. The interrogator then waits, in step 914, for the second half of the frame. At step 916, the interrogator can attempt to detect any interference from other interrogators, while listening for RFID tag transmissions. If interference is detected at 918, the interrogator delays, at step 920, its start of next frame time to coincide with the start of frame it detected from another interrogator at 918. If no interference is detected, the interrogator processes any RFID tag transmissions it may have received at step 922. The process then repeats.

Basically, if two interrogators come close enough to interfere, the interrogator which is first to detect interference adjusts its frame synchronization timing to match the other interrogator. Because, they are out of sync, one interrogator will have to be first in detecting interference. The environment can become much more complicated if more than two interrogators are out of frame synchronization, but realistically that is unlikely, since the frame periods are typically on the order of microseconds and physical movements take a much longer time, so by the time a third interrogator is out of sync with the first two, those two should have synchronized.

There are many methods of distinguishing interrogation interference with RFID tag transmissions. Most of these methods involve incorporating certain patterns in the transmission protocol.

Figure 10:
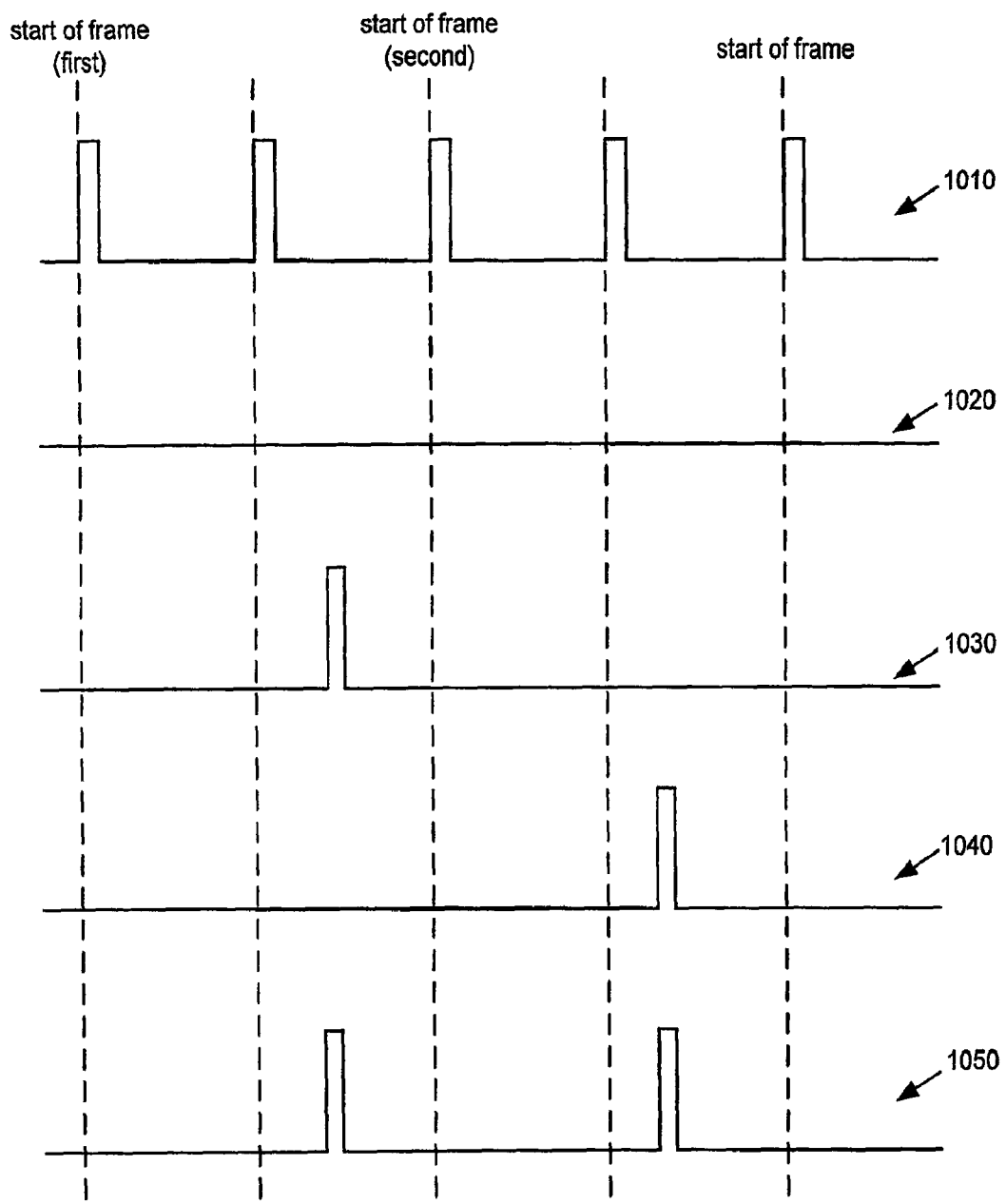
FIG. 10 is a diagram illustrating an example embodiment of RFID tag response encoding in accordance with one embodiment.

FIG. 10 illustrates a specific embodiment of such an encoding. Graph 1010 shows an interrogator's frame synchronization pulses. An RFID tag can transmit a "one" by sending a pulse in response in the second half of a first frame and no pulse in a second frame as depicted in graph 1030 and a "zero" by sending a no pulse in a first frame and a pulse in the second half of a second frame as depicted in graph 1040. In the event of no pulse as in graph 1020, there is no response from an RFID tag. In the event of a pulse in the second half frame of both a first and second frame, as in graph 1050, interference from another RFID interrogator can be deduced. More complex patterns in RFID tags transmissions can be implemented, but often these complexities lead to many more false readings.

Figure 11:
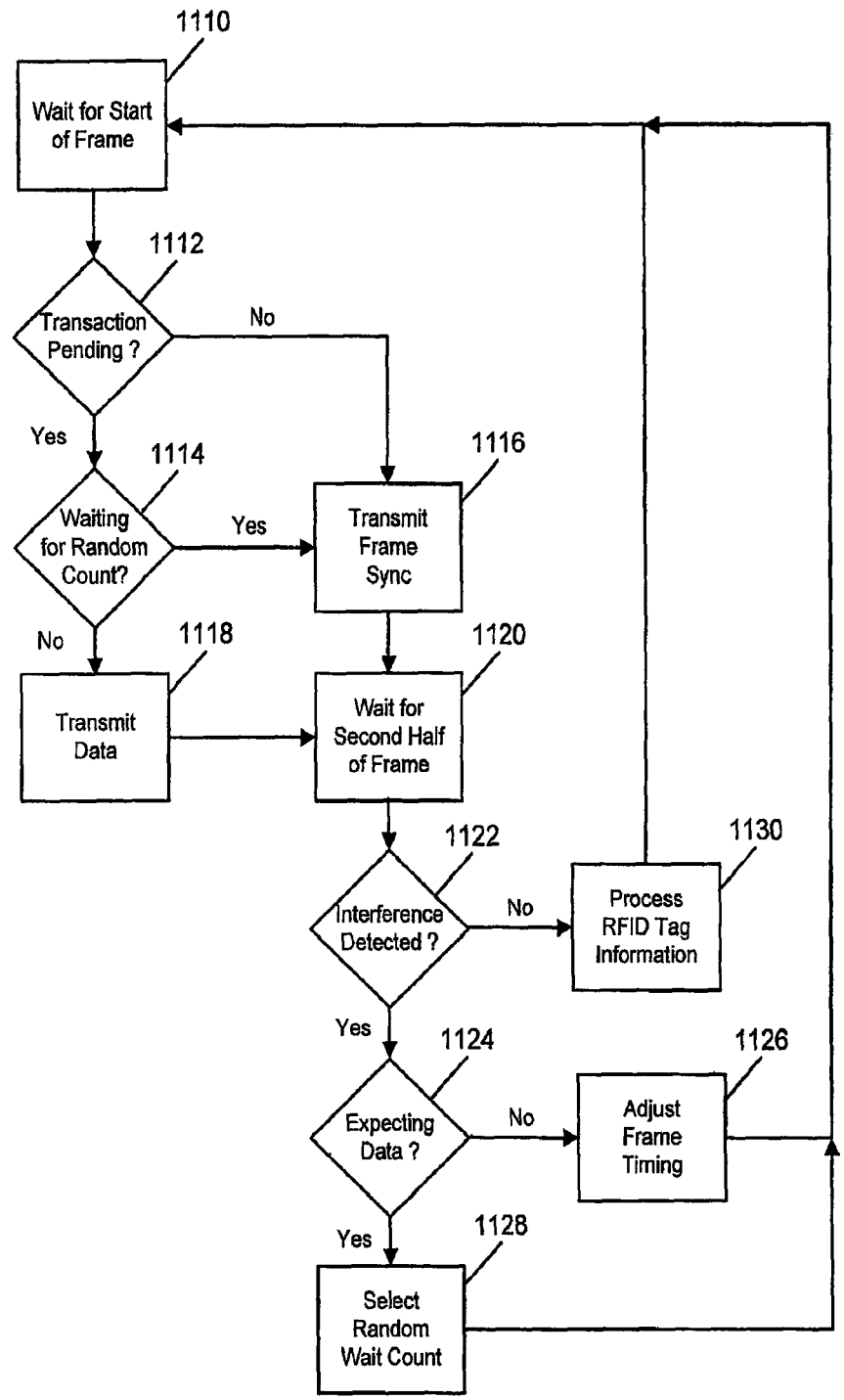
FIG. 11 is a diagram illustrating an example detecting interference in accordance with one embodiment.

FIG. 11 is a flowchart illustrating an example method for synchronization that can alleviate some of the confusion associated with detecting interference. In the example of FIG. 11, interrogators only attempt synchronization when not expecting RFID tag transmissions. In a practical system, RFID interrogators spend much of their time sending frame synchronization pulses, but not expecting a return transmission. In step 1110, the interrogator waits for its internal clock to indicate a start of frame. In step 1112, the interrogator decides if it has a pending transaction with an RFID tag, if so, at step 1114, it decides whether it is waiting on a random count due to the detection of interference from a previous iteration. If so or if there is no pending transaction, the interrogator transmits a frame synchronization pulse at step 1116. Otherwise, if there is a pending transaction and the interrogator is not waiting a random count or that count has expired hence no longer waiting, it transmits its data at step 1118. The interrogator then waits for the second half of the frame at 1120. At step 1122, the interrogator can attempt to detect any interference from other interrogators, while listening for RFID tag transmissions.

If interference is detected at 1122, the interrogator behaves differently depending on whether it is expecting data from an RFID tag. If it is not expecting data at step 1124, the interrogator delays, at step 1126, its start of next frame time to coincide with the start of frame it detected from the interfering interrogator at 1122. If it is expecting data, the interrogator selects a random number of frames to wait in step 1128. If no interference is detected, the interrogator processes any RFID tag transmissions it may have received at step 1130. The process then repeats. In the event multiple interrogators are attempting to interrogate at the same time, the random count gives an interval when none of the interrogators are expecting data to synchronize their respective frame synchronization pulses.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A synchronized RFID interrogation system, comprising:
   a communications channel;
   a synchronization master communicably coupled to the communications channel, the synchronization master configured to send synchronization signals via the communications channel;
   a first RFID interrogator communicably coupled to the communications channel, the first RFID interrogator configured to: (1) select a first time out period based at least in part upon an output from a first random number generator, wherein said output from the first random number generator is independent of any other RFID interrogator in the synchronized environment, (2) register a synchronization failure upon waiting a first predetermined period of time without receiving synchronization signals, and (3) become a new synchronization master if no synchronization signals are detected after registering the synchronization failure and after the first time out period, wherein becoming the new synchronization master comprises sending synchronization signals via the communications channel; and,
   a second RFID interrogator communicably coupled to the communications channel, the second RFID interrogator configured to: (1) select a second time out period based at least in part upon an output from a second random number generator, wherein said output from the second random number generator is independent of any other RFID interrogator in the synchronized environment, (2) register a synchronization failure upon waiting a second predetermined period of time without receiving synchronization signals, and (3) become the new synchronization master if no synchronization signals are detected after registering the synchronization failure and after the second time out period, wherein becoming the new synchronization master comprises sending synchronization signals via the communications channel,
   wherein the first predetermined period of time and the second predetermined period of time are the same.

2. The synchronized RFID interrogation system of claim 1, wherein the synchronization master is a pulse generator.

3. The synchronized RFID interrogation system of claim 1, wherein the communications channel is a wired connection.

4. The synchronized RFID interrogation system of claim 1, wherein the first RFID interrogator is further configured to:
   listen for synchronization signals over the communications channel while waiting for a frame period to elapse; and
   cease becoming the new synchronization master if synchronization signals are detected.

5. The synchronized RFID interrogation system of claim 1, wherein the first and second predetermined period of time comprises a fixed component.

6. The synchronized RFID interrogation system of claim 1, wherein the first RFID interrogator selects the first time out period after registering the synchronization failure; and, wherein the second RFID interrogator selects the second time out period after registering the synchronization failure.

7. The synchronized RFID interrogation system of claim 1, wherein the first RFID interrogator is further configured to (4) detect and then avoid conflicts in becoming the new synchronization master; and, wherein the second RFID interrogator is configured to (4) detect and then avoid conflicts in becoming the new synchronization master.

* * * * *